United States Patent
Oota et al.

(10) Patent No.: US 6,577,006 B1
(45) Date of Patent: Jun. 10, 2003

(54) III-V NITRIDE BASED SEMICONDUCTOR LIGHT EMITTING DEVICE

(75) Inventors: Kiyoshi Oota, Neyagawa (JP); Nobuhiko Hayashi, Osaka (JP)

(73) Assignee: Sanyo Electric Co., Ltd., Osaka-Fu (JP)

( * ) Notice: Subject to any disclaimer, the term of this patent is extended or adjusted under 35 U.S.C. 154(b) by 0 days.

(21) Appl. No.: 09/473,405

(22) Filed: Dec. 28, 1999

(30) Foreign Application Priority Data

Dec. 28, 1998 (JP) .......................... 10-372685
Dec. 2, 1999 (JP) .......................... 11-342915

(51) Int. Cl.[7] .......................... H01L 33/00; H01L 23/48
(52) U.S. Cl. .......................... 257/745; 257/94; 257/99; 438/22; 438/24; 438/604
(58) Field of Search .......................... 257/11, 745, 78, 257/762, 751, 99, 94; 372/45, 46, 43; 438/604, 22, 24

(56) References Cited

U.S. PATENT DOCUMENTS 5,990,500 A  * 11/1999  Okazaki .......................... 257/99

FOREIGN PATENT DOCUMENTS

| JP | 8-274372 | 10/1996 |
|----|----------|---------|
| JP | 9-232632 | 9/1997 |
| JP | 10-22494 | 1/1998 |
| JP | 10-200161 | 7/1998 |
| JP | 10-242588 | 9/1998 |
| JP | 11-274562 A | * 10/1999 |

OTHER PUBLICATIONS

F. Ren et al., "Thermal stability of Ti/Pt/Au nonalloyed ohmic contacts on InN", Applied Physics Letters, vol. 64 (12), pp 1508–1510, Mar. 21, 1994.*

* cited by examiner

Primary Examiner—Tom Thomas
Assistant Examiner—Donghee Kang
(74) Attorney, Agent, or Firm—Akin Gump Strauss Hauer & Feld, L.L.P.

(57) ABSTRACT

An undoped GaN buffer layer, an n-type GaN layer and a p-type GaN layer are successively formed on a sapphire substrate, and a partial region from the p-type GaN layer to the n-type GaN layer is removed, to expose the n-type GaN layer. Ti films having a thickness of 3 to 100 Å and Pt films are successively formed on the p-type GaN layer and on the exposed upper surfaces of the n-type GaN layer. Consequently, a p electrode in ohmic contact with the p-type GaN layer and an n electrode in ohmic contact with the n-type GaN layer are formed without being alloyed by heat treatment.

8 Claims, 6 Drawing Sheets

III-V NITRIDE BASED SEMICONDUCTOR LIGHT EMITTING DEVICE

BACKGROUND OF THE INVENTION

1. Field of the Invention

The present invention relates to a semiconductor device composed BN (boron nitride), GaN (gallium nitride), AlN (aluminum nitride), InN (indium nitride) or TlN (thallium nitride) or an III–V group nitride based semiconductor (hereinafter referred to as a nitride based semiconductor) which is their mixed crystal and a method of fabricating the same.

2. Description of the Background Art

In recent years, GaN based light emitting semiconductor devices have been put to practical use as light emitting semiconductor devices such as light emitting diodes or semiconductor laser devices which emit light in blue or violet. Transistors using GaN based semiconductors have been also proposed. In such GaN based semiconductor devices, electrodes in ohmic contact with the GaN based semiconductor are required.

FIGS. 6 and 7 are schematic cross-sectional views showing the steps of an example of a method of fabricating a conventional GaN based light emitting diode.

As shown in FIG. 6(a), a GaN buffer layer 22, an n-type GaN layer 23, and a p-type GaN layer 24 are first successively formed on a sapphire substrate 21. Thereafter, a partial region from the p-type GaN layer 24 to the n-type GaN layer 23 is etched by an RIE (Reactive Ion Etching) method or the like, to expose the n-type GaN layer 23.

As shown in FIG. 6(b), a photoresist pattern 31 is then formed on the p-type GaN layer 24 and on the exposed upper surface of the n-type GaN layer 23. The photoresist pattern 31 has an opening 32 on the p-type GaN layer 24. In this state, a Pt film 25a having a thickness of 2000 Å is formed by an electron beam evaporation method on the p-type GaN layer 24 inside the opening 32 and on the photoresist pattern 31.

As shown in FIG. 6(c), the Pt film 25a on the photoresist pattern 31, together with the photoresist pattern 31, is then removed by a lift-off method.

As shown in FIG. 7(d), a photoresist pattern 33 is then formed on the p-type GaN layer 24, on a p electrode 25, and on the exposed upper surface of the n-type GaN layer 23. The photoresist pattern 33 has an opening 34 on the exposed upper surface of the n-type GaN layer 23. In this state, a Ti film 26a having a thickness of 200 Å and an Al film 27a having a thickness of 5000 Å are successively formed by an electron beam evaporation method on the upper surface of the n-type GaN layer 23 inside the opening 34 and on the photoresist pattern 33.

Further, as shown in FIG. 7(e), the Ti film 26a and the Al film 27a on the photoresist pattern 33, together with the photoresist pattern 33, are removed by a lift-off method. Thereafter, heat treatment for five minutes is carried out at a temperature of 600° C. in an $N_2$ gas atmosphere.

In the above-mentioned manner, p-side and n-side ohmic electrodes are formed.

The p electrode 25 composed of a Pt film in the above-mentioned conventional GaN based light emitting diode has a weak adhesive force. Accordingly, the p electrode 25 is easily stripped in the subsequent processes such as wire bonding. Further, the p electrode 25 is stripped relatively simply when a measuring needle is brought into contact therewith in examination of ohmic characteristics, for example.

On the other hand, alloying by heat treatment is required in order to obtain ohmic contact. Further, the p electrode 25 and an n electrode 30 must be formed in different processes. Consequently, the processes of forming the p electrode 25 and the n electrode 30 become complicated, so that it takes long.

An ohmic electrode having a laminated structure of a Ti film and an Au film has been also proposed. The ohmic electrode can be formed without being alloyed by heat treatment. However, the resistance of the ohmic electrode is easily increased at the time of heat-treating the other layers.

SUMMARY OF THE INVENTION

An object of the present invention is to provide a semiconductor device comprising a stable ohmic electrode which is not easily stripped and can be formed in a simple process on a nitride based semiconductor.

Another object of the present invention is to provide a method of fabricating a semiconductor device in which an ohmic electrode which is not easily stripped and is stable can be formed in a simple process on a nitride based semiconductor.

A semiconductor device according to one aspect of the present invention comprises a p-type nitride based semiconductor; and an ohmic electrode formed on the p-type nitride based semiconductor. The ohmic electrode comprises a first metal film having a thickness of not less than 3 Å nor more than 150 Å which is formed in contact with the p-type nitride based semiconductor and is composed of titanium, and a second metal film which is formed in contact with the first metal film and is composed of platinum or palladium.

In the ohmic electrode in the semiconductor device, the first metal film composed of titanium has the function of cleaning the surface of the p-type nitride based semiconductor, to make ohmic contact between the second metal film composed of platinum or palladium and the p-type nitride based semiconductor easy. Consequently, the ohmic electrode is formed in a simple process without being alloyed by heat treatment.

Since the first metal film composed of titanium has a strong adhesive force to the p-type nitride based semiconductor, an adhesive force of the ohmic electrode to the p-type nitride based semiconductor is improved. Consequently, the ohmic electrode is not easily stripped.

Particularly, the thickness of the first metal film is preferably not less than 3 Å nor more than 130 Å, more preferably not less than 3 Å nor more than 130 Å, still more preferably not less than 3 Å nor more than 50 Å, and most preferably not less than 3 Å nor more than 10 Å. Consequently, sufficient ohmic characteristics can be obtained while preventing the ohmic electrode from being stripped.

The semiconductor device may further comprise a third metal film which is formed in contact with the second metal film and is composed of gold.

Thus, wire bonding can be easily performed. In this case, since the ohmic electrode composed of the first metal film and the second metal film can be formed without being alloyed by heat treatment, the first metal film, the second metal film and the third metal film can be formed in the same process.

The p-type nitride based semiconductor may contain at least one of boron, gallium, aluminum, indium and thallium.

A semiconductor device according to another aspect of the present invention comprises an n-type nitride based semiconductor; and an ohmic electrode formed on the n-type nitride based semiconductor. The ohmic electrode comprises a first metal film having a thickness of not less than 3 Å nor more than 100 Å which is formed in contact with the n-type nitride based semiconductor and is composed of titanium, and a second metal film which is formed in contact with the first metal film and is composed of platinum or palladium.

In the ohmic electrode in the semiconductor device, the first metal film composed of titanium has the function of cleaning the surface of the n-type nitride based semiconductor, to make ohmic contact between the second metal film composed of platinum or palladium and the n-type nitride based semiconductor easy. Consequently, the ohmic electrode is formed in a simple process without being alloyed by heat treatment.

Since the first metal film composed of titanium has a strong adhesive force to the n-type nitride based semiconductor, an adhesive force of the ohmic electrode to the n-type nitride based semiconductor is improved. Consequently, the ohmic electrode is not easily stripped.

Particularly, the thickness of the first metal film is preferably not less than 3 Å nor more than 50 Å, more preferably not less than 3 Å nor more than 30 Å, and still more preferably not less than 3 Å nor more than 10 Å. Consequently, sufficient ohmic characteristics can be obtained while preventing the ohmic electrode from being stripped.

The semiconductor device may further comprise a third metal film which is formed in contact with the second metal film and is composed of gold.

Thus, wire bonding can be easily performed. In this case, since the ohmic electrode composed of the first metal film and the second metal film can be formed without being alloyed by heat treatment, the first metal film, the second metal film and the third metal film can be formed in the same process.

The n-type nitride based semiconductor may contain at least one of boron, gallium, aluminum, indium and thallium.

A semiconductor device according to still another aspect of the present invention comprises a p-type nitride based semiconductor; an n-type nitride based semiconductor provided so as to be brought into contact with the p-type nitride based semiconductor; a first ohmic electrode formed on the p-type nitride based semiconductor; and a second ohmic electrode formed on the n-type nitride based semiconductor. The first ohmic electrode comprises a first metal film having a thickness of not less than 3 Å nor more than 100 Å which is formed in contact with the p-type nitride based semiconductor and is composed of titanium, and a second metal film which is formed in contact with the first metal film and is composed of platinum or palladium. The second ohmic electrode comprises a third metal film having a thickness of not less than 3 Å nor more than 100 Å which is formed in contact with the n-type nitride based semiconductor and is composed of titanium, and a fourth metal film which is formed in contact with the third metal film and is composed of platinum or palladium.

In the first ohmic electrode and the second ohmic electrode in the semiconductor device, the first and third metal films composed of titanium respectively have the functions of cleaning the surfaces of the p-type nitride based semiconductor and the n-type nitride based semiconductor, to make ohmic contact between the second metal film composed of platinum or palladium and the p-type nitride based semiconductor and ohmic contact between the fourth metal film composed of platinum or palladium and the n-type nitride based semiconductor easy. Consequently, the ohmic electrode is formed in a simple process without being alloyed by heat treatment.

Since the first and third metal films composed of titanium respectively have strong adhesive forces to the p-type nitride based semiconductor and the n-type nitride based semiconductor, respective adhesive forces of the first ohmic electrode and the second ohmic electrode to the p-type nitride based semiconductor and the n-type nitride based semiconductor are improved. Consequently, the first and second ohmic electrodes are not easily stripped.

Furthermore, the first ohmic electrode and the second ohmic electrode have the same structure, and are composed of the same material. Accordingly, the first and second ohmic electrodes can be simultaneously formed in the same process. Consequently, the number of fabricating processes is reduced, thereby making it possible to shorten fabricating time.

As a result, ohmic electrodes which are stable and reliable can be easily formed, respectively, on the p-type nitride based semiconductor and the n-type nitride based semiconductor.

The thickness of the first and third metal films is preferably not less than 3 Å nor more than 30 Å, and more preferably not less than 3 Å nor more than 10 Å. Consequently, sufficient ohmic characteristics can be obtained while preventing the first and second ohmic electrodes from being stripped.

The semiconductor device may further comprise a fifth metal film which is formed in contact with the second metal film and is composed of gold, and a sixth metal film which is formed in contact with the fourth metal film and is composed of gold.

Thus, wire bonding can be easily performed. In this case, since the first ohmic electrode composed of the first metal film and the second metal film as well as the second ohmic electrode composed of the third metal film and the fourth metal film can be formed without being alloyed by heat treatment, the first metal film, the second metal film and the fifth metal film as well as the third metal film, the fourth metal film and sixth metal film can be formed in the same process.

A method of fabricating a semiconductor device according to still another aspect of the present invention comprises the steps of forming a p-type nitride based semiconductor; and forming a first metal film having a thickness of not less than 3 Å nor more than 150 Å which is composed of titanium and a second metal film which is composed of platinum or palladium in this order in contact with the p-type nitride based semiconductor, to form an ohmic electrode without carrying out heat treatment.

In the fabricating method, the first metal film composed of titanium has the function of cleaning the surface of the p-type nitride based semiconductor, to make ohmic contact between the second metal film composed of platinum or palladium and the p-type nitride based semiconductor easy. Consequently, the ohmic electrode is formed in a simple process without being alloyed by heat treatment.

Since the first metal film composed of titanium has a strong adhesive force to the p-type nitride based semiconductor, an adhesive force of the ohmic electrode to the p-type nitride based semiconductor is improved. Consequently, the ohmic electrode is not easily stripped.

Particularly, the thickness of the first metal film is preferably not less than 3 Å nor more than 130 Å, more preferably not less than 3 Å nor more than 100 Å, still more preferably not less than 3 Å nor more than 50 Å, and most preferably not less than 3 Å nor more than 10 Å. Consequently, sufficient ohmic characteristics can be obtained while preventing the ohmic electrode from being stripped.

A method of fabricating a semiconductor device according to still another aspect of the present invention comprises the steps of forming an n-type nitride based semiconductor; and forming a first metal film having a thickness of not less than 3 Å nor more than 100 Å which is composed of titanium and a second metal film which is composed of platinum or palladium in this order in contact with the n-type nitride based semiconductor, to form an ohmic electrode without carrying out heat treatment.

In the fabricating method, the first metal film composed of titanium has the function of cleaning the surface of the n-type nitride based semiconductor, to make ohmic contact between the second metal film composed of platinum or palladium and the n-type nitride based semiconductor easy. Consequently, the ohmic electrode is formed in a simple process without being alloyed by heat treatment.

Since the first metal film composed of titanium has a strong adhesive force to the n-type nitride based semiconductor, an adhesive force of the ohmic electrode to the n-type nitride based semiconductor is improved. Consequently, the ohmic electrode is not easily stripped.

Particularly, the thickness of the first metal film is preferably not less than 3 Å nor more than 50 Å, more preferably not less than 3 Å nor more than 30 Å, and still more preferably not less than 3 Å nor more than 10 Å. Consequently, sufficient ohmic characteristics can be obtained while preventing the ohmic electrode from being stripped.

In a method of fabricating a semiconductor device according to still another aspect of the present invention comprises the steps of forming a p-type nitride based semiconductor and an n-type nitride based semiconductor which are brought into contact with each other; and forming a first metal film having a thickness of not less than 3 Å nor more than 100 Å which is composed of titanium and a second metal film which is composed of platinum or palladium in this order in contact with the p-type nitride based semiconductor, to form a first ohmic electrode without carrying out heat treatment, and forming a third metal film having a thickness of not less than 3 Å nor more than 100 Å which is composed of titanium and a fourth metal film which is composed of platinum or palladium in this order in contact with the n-type nitride based semiconductor, to form a second ohmic electrode without carrying out heat treatment.

In the fabricating method, the first and third metal films composed of titanium respectively have the functions of cleaning the surfaces of the p-type nitride based semiconductor and the n-type nitride based semiconductor, to make ohmic contact between the second metal film composed of platinum or palladium and the p-type nitride based semiconductor and ohmic contact between the fourth metal film composed of platinum or palladium and the n-type nitride based semiconductor easy. Consequently, the ohmic electrode is formed in a simple process without being alloyed by heat treatment.

Since the first and third metal films composed of titanium respectively have strong adhesive forces to the p-type nitride based semiconductor and the n-type nitride based semiconductor, respective adhesive forces of the first ohmic electrode and the second ohmic electrode to the p-type nitride based semiconductor and the n-type nitride based semiconductor are improved. Consequently, the first and second ohmic electrodes are not easily stripped.

Furthermore, the first ohmic electrode and the second ohmic electrode have the same structure, and are composed of the same material. Accordingly, the first and second ohmic electrodes can be simultaneously formed in the same process. Consequently, the number of fabricating processes is reduced, thereby making it possible to shorten fabrication time.

As a result, ohmic electrodes which are stable and reliable can be easily formed, respectively, on the p-type nitride based semiconductor and the n-type nitride based semiconductor.

The thickness of the first and third metal films is preferably not less than 3 Å nor more than 30 Å, and more preferably not less than 3 Å nor more than 10 Å. Consequently, sufficient ohmic characteristics can be obtained while preventing the first and second ohmic electrodes from being stripped.

The fabricating method may comprise the step of forming a fifth metal film composed of gold in contact with the second metal film and forming a sixth metal film composed of gold in contact with the fourth metal film.

Thus, wire bonding can be easily performed. In this case, since the first ohmic electrode composed of the first metal film and the second metal film as well as the second ohmic electrode composed of the third metal film and the fourth metal film can be formed without being alloyed by heat treatment, the first metal film, the second metal film and the fifth metal film as well as the third metal film, the fourth metal film and sixth metal film can be formed in the same process.

The foregoing and other object, features, aspects and advantages of the present invention will become more apparent from the following detailed description of the present invention when taken in conjunction with the accompanying drawings.

DESCRIPTION OF THE PREFERRED EMBODIMENTS

Figure 1:
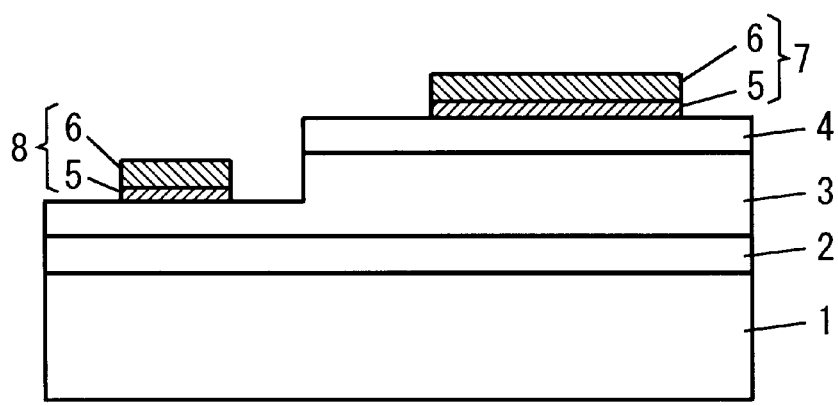
FIG. 1 is a schematic cross-sectional view of a GaN based light emitting diode in one embodiment of the present invention.

FIG. 1 is a schematic cross-sectional view of a GaN based light emitting diode in one embodiment of the present invention.

In FIG. 1, an undoped GaN buffer layer 2 having a thickness of 0.2 μm, an n-type GaN layer 3 having a thickness of 3 μm, and a p-type GaN layer 4 having a thickness of 0.5 μm are successively formed on a sapphire substrate 1. The carrier concentration of the n-type GaN layer 3 is $5 \times 10^{17}$ cm$^{-3}$, and the carrier concentration of the p-type GaN layer 4 is $1 \times 10^{17}$ cm$^{-3}$.

A partial region from the p-type GaN layer 4 to the n-type GaN layer 3 is removed by etching, so that the n-type GaN layer 3 is exposed. A p electrode 7 composed of a Ti (titanium) film 5 and a Pt (platinum) film 6 is formed on the p-type GaN layer 4. The p electrode 7 is in ohmic contact with the p-type GaN layer 4. Further, an n electrode 8 composed of a Ti film 5 and a Pt film 6 is formed on the exposed upper surface of the n-type GaN layer 3. The n electrode 8 is in ohmic contact with the n-type GaN layer 3.

In the present embodiment, the thickness of the Ti film 5 in the p electrode 7 and the n electrode 8 is 10 Å. Further, the thickness of the Pt film 6 in the p electrode 7 and the n electrode 8 is preferably not less than 500 Å, and is set to 4000 Å in the present embodiment.

Figure 2:
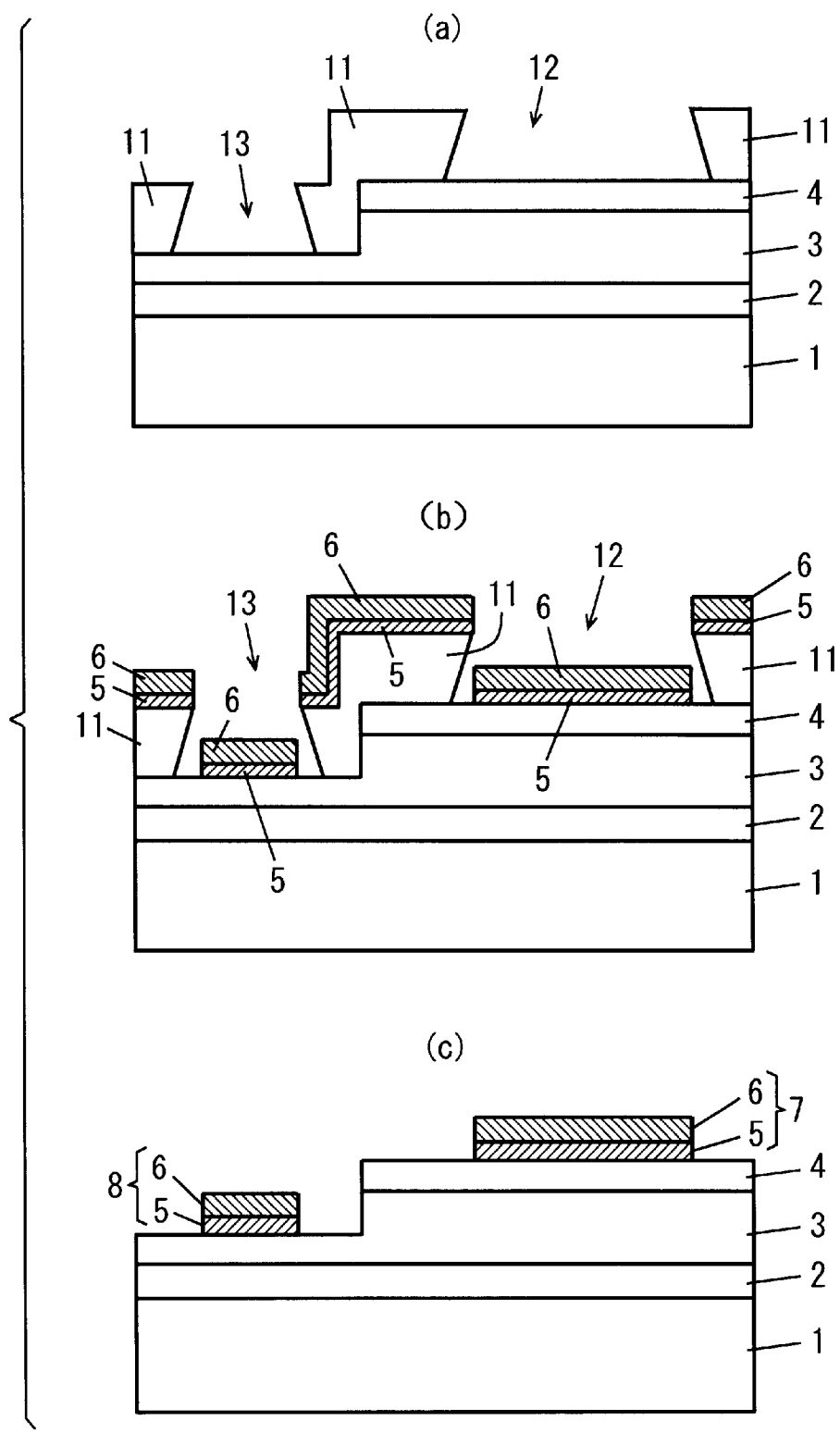
FIG. 2 is a schematic cross-sectional view showing the steps of a method of fabricating the GaN based light emitting diode shown in FIG. 1.

FIG. 2 is a schematic cross-sectional view showing the steps of a method of fabricating the GaN based light emitting diode shown in FIG. 1.

As shown in FIG. 2(a), an undoped GaN buffer layer 2, an n-type GaN layer 3 and a p-type GaN layer 4 are successively formed by an MOCVD (Metal Organic Chemical Vapor Deposition) method or the like on a sapphire substrate 1. A partial region from the p-type GaN layer 4 to the n-type GaN layer 3 is removed by an RIE (Reactive Ion Etching) method or the like, to expose the n-type GaN layer 3. Further, a photoresist composed of PMMA (polymethyl methacrylate) is formed on the p-type GaN layer 4 and on the exposed upper surface of the n-type GaN layer 3, and is patterned by a photolithographic technique, to form a photoresist pattern 11. The photoresist pattern 11 has openings 12 and 13, respectively, on the p-type GaN layer 4 and the exposed upper surface of the n-type GaN 3.

As shown in FIG. 2(b), a Ti film 5 having a thickness of 10 Å and a Pt film 6 having a thickness of 4000 Å are successively formed by an electron beam evaporation method on the p-type GaN layer 4 inside the opening 12 of the photoresist pattern 11, on the n-type GaN layer 3 inside the opening 13, and on the photoresist pattern 11.

Furthermore, as shown in FIG. 2(c), the Ti film 5 and the Pt film 6 on the photoresist pattern 11, together with the photoresist pattern 11, are removed by a lift-off method by cleaning using an organic solvent such as acetone. Consequently, a p electrode 7 composed of the Ti film 5 and the Pt film 6 which is brought into ohmic contact with the p-type GaN layer 4 is formed, and an n electrode 8 composed of the Ti film 5 and the Pt film 6 which is brought into ohmic contact with the n-type GaN layer 3 is simultaneously formed, without being alloyed by heat treatment.

The Ti films 5 in the p electrode 7 and the n electrode 8 in the light emitting diode according to the present embodiment adsorbs an oxygen component, for example, on the surface of the GaN based semiconductor, to make ohmic contact between the Pt film 6 and the GaN based semiconductor easy. Consequently, the p electrode 7 and the n electrode 8 that are ohmic electrodes are formed in a simple process without being alloyed by heat treatment.

Since the Ti films 5 have a strong adhesive force to the GaN based semiconductors, adhesive forces of the p electrode 7 and the n electrode 8 to the GaN based semiconductors are improved. Consequently, the p electrode 7 and the n electrode 8 are not easily stripped.

Furthermore, the p electrode 7 and the n electrode 8 have the same structure and are composed of the same material. Accordingly, the p electrode 7 and the n electrode 8 can be simultaneously formed in the same process. Consequently, the number of fabricating processes is reduced, thereby making it possible to shorten fabricating time.

As a result, it is possible to easily form the p electrode 7 and the n electrode 8, which are stable and reliable, making ohmic contact with the GaN based semiconductors.

The Pt films 6 in the p electrode 7 and the n electrode 8 may be replaced with Pd (palladium) films.

Also in this case, ohmic contact between the Pd films and the GaN based semiconductors becomes easy by the function of the Ti films 5. Consequently, the p electrode 7 and the n electrode 8 that are ohmic electrodes are formed in a simple process without being alloyed by heat treatment.

Adhesive forces of the p electrode 7 and the n electrode 8 to the GaN based semiconductors are improved by the function of the Ti films 5. Consequently, the p electrode 7 and the n electrode 8 are not easily stripped.

Furthermore, the p electrode 7 and the n electrode 8 have the same structure and are composed of the same material. Accordingly, the p electrode 7 and the n electrode 8 can be simultaneously formed in the same process. Consequently, the number of fabricating processes is reduced, thereby making it possible to shorten fabricating time.

As a result, it is possible to easily form the p electrode 7 and the n electrode 8, which are stable and reliable, making ohmic contact with the GaN based semiconductors without carrying out heat treatment.

Furthermore, the Pt film 6 in the p electrode 7 may be replaced with an Ni (nickel) film. Also in this case, ohmic contact between the Ni film and the p-type GaN based semiconductor becomes easy by the function of the Ti film 5. Consequently, the p electrode 7 that is an ohmic electrode is formed in a simple process without being alloyed by heat treatment.

Furthermore, an adhesive force of the p electrode 7 to the p-type GaN based semiconductor is improved by the function of the Ti film 5. Consequently, the p electrode 7 is not stripped.

Figure 3:
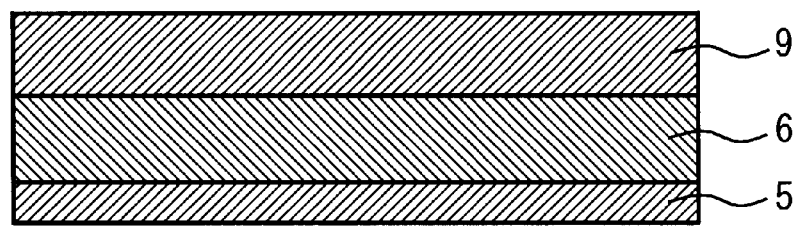
FIG. 3 is a schematic cross-sectional view of an ohmic electrode on which a pad electrode is laminated.

FIG. 3 is a schematic cross-sectional view of an ohmic electrode on which a pad electrode is laminated. As shown in FIG. 3, a pad electrode 9 composed of an Au film is formed on an ohmic electrode composed of a Ti film 5 and a Pt film 6, thereby making it possible to easily perform wire bonding.

In this case, the ohmic electrode composed of the Ti film 5 and the Pt film 6 is formed without being alloyed by heat treatment. Accordingly, the Ti film 5, the Pt film 6, and the pad electrode 9 can be continuously formed in the same process. Consequently, an ohmic electrode having a Ti/Pt/Au structure is formed on a GaN based semiconductor layer, thereby making it possible to simultaneously form a pad electrode for wire bonding.

On the other hand, in forming a pad electrode on a conventional ohmic electrode composed of a Ti film and an Al film, a laminated structure of a Ti film, a Pt film, and an Au film is formed as a pad electrode on the ohmic electrode. Since Ti and Au easily react with each other, the Pt film must be thus inserted between the Ti film and the Au film. In this case, in forming the ohmic electrode composed of the Ti film and the Al film, the ohmic electrode must be alloyed by heat treatment. Accordingly, it is necessary to separately carry out the process of forming the ohmic electrode composed of a laminated structure of Ti/Al and the process of forming a pad electrode composed of a laminated structure of Ti/Pt/Au.

The current-voltage characteristics of the p electrode 7 and the n electrode 8 in the above-mentioned embodiment were measured by changing the thickness of the Ti film 5.

Figure 4:
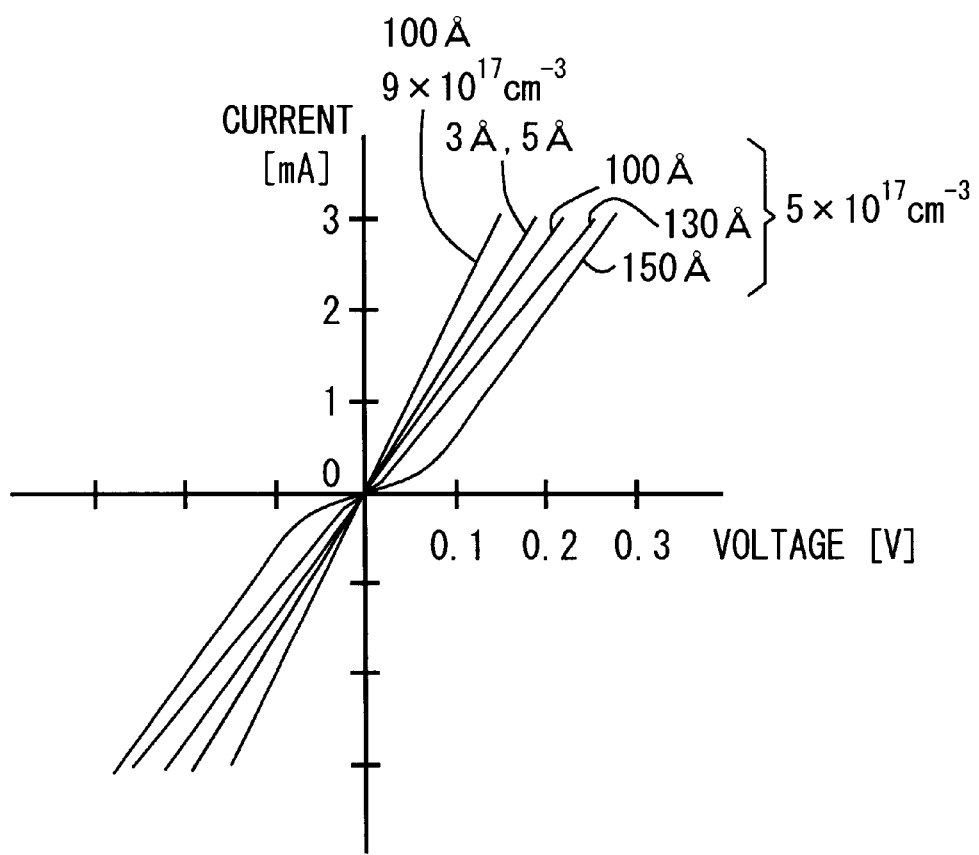
FIG. 4 is a diagram showing the result of measurement of current-voltage characteristics of a p electrode.

FIG. 4 is a diagram showing the result of measurement of the current-voltage characteristics of the p electrodes 7. In the measurement, a pair of p electrodes 7 was formed on each p-type GaN layer, to measure a voltage applied between the p electrodes 7 and a current flowing between the p electrodes 7.

First, the carrier concentration of the p-type GaN layers were set to $5 \times 10^{17}$ cm$^{-3}$, and the thicknesses of the Ti films 5 in the p electrodes 7 were set to 3 Å, 5 Å, 100 Å, 130 Å, and 150 Å. The thickness of the Pt films 6 was set to 4000 Å. The carrier concentration of the p-type GaN layers was set to $9 \times 10^{17}$ cm$^{-3}$, and the thickness of the Ti films 5 in the p electrodes 7 was set to 100 Å.

As shown in FIG. 4, in a case where the carrier concentration of the p-type GaN layer is $5 \times 10^{17}$ cm$^{-3}$, complete ohmic characteristics are obtained when the thickness of the Ti film 5 is 3 Å, 5 Å and 100 Å, and approximate ohmic characteristics are obtained when the thickness of the Ti film 5 is 130 Å. When the thickness of the Ti film 5 is 150 Å, slight rectification characteristics appear.

In a case where the carrier concentration of the p-type GaN layer is $9 \times 10^{17}$ cm$^{-3}$, complete ohmic characteristics are obtained when the thickness of the Ti film 5 is 100 Å.

Consequently, the thickness of the Ti film 5 in the p electrode 7 is preferably not more than 130 Å, and more preferably not more than 100 Å. When the n electrode 8 is simultaneously formed, the thickness of the Ti film 5 is preferably not more than 100 Å, more preferably not more than 50 Å, still more preferably not more than 30 Å, and most preferably not more than 10 Å. From the point of view of adhesive strength to the p-type GaN layer, the thickness of the Ti film 5 is preferably not less than 3 Å, and more preferably not less than 5 Å.

A scratch test was conducted using a measuring needle for examining ohmic characteristics with respect to the p electrodes 7 formed on the p-type GaN layers. Consequently, the p electrode 7 was not stippled in all cases where the thickness of the Ti film 5 is 3 Å, 5 Å, 100 Å, 130 Å, and 150 Å. On the other hand, the p electrode 7 was striped in a case where it is composed of only the Pt film 6.

Figure 5:
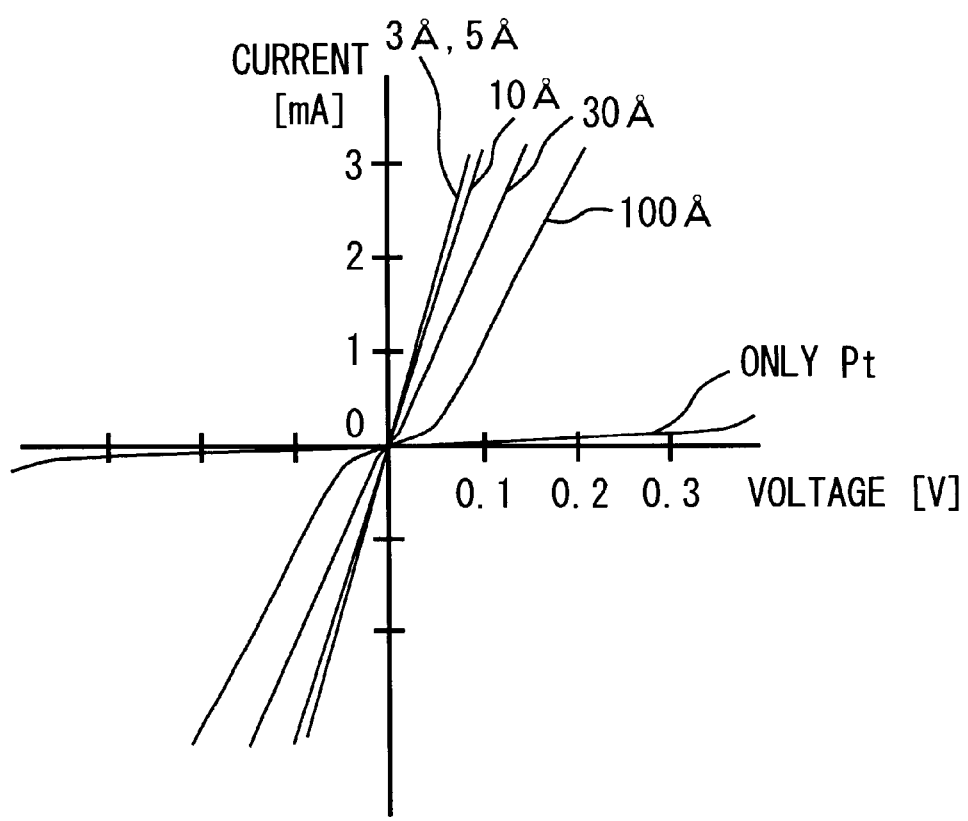
FIG. 5 is a diagram showing the result of measurement of current-voltage characteristics of an n electrode.
Figure 6:
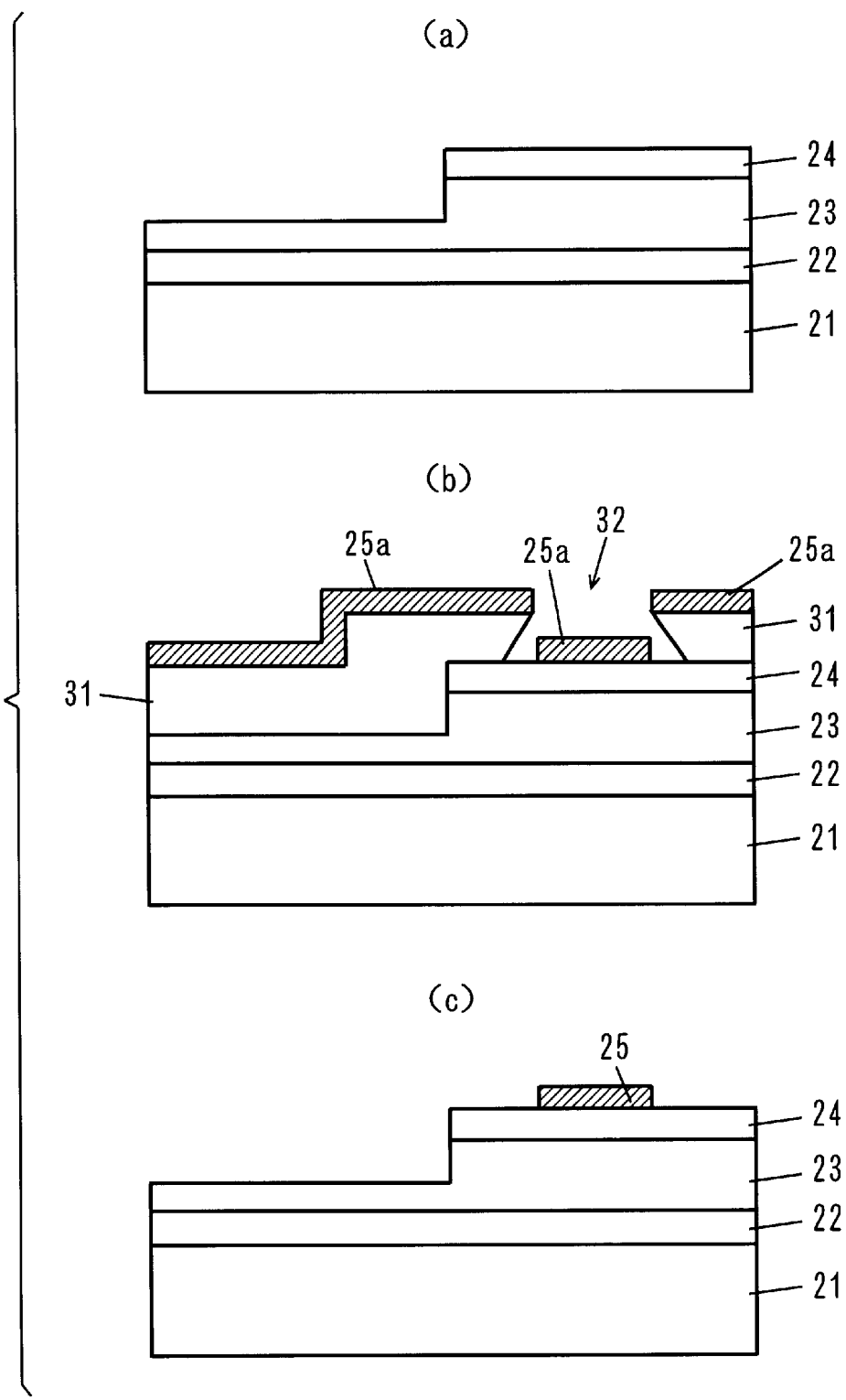
FIG. 6 is a schematic cross-sectional view showing the steps of a method of fabricating a conventional GaN based light emitting diode.
Figure 7:
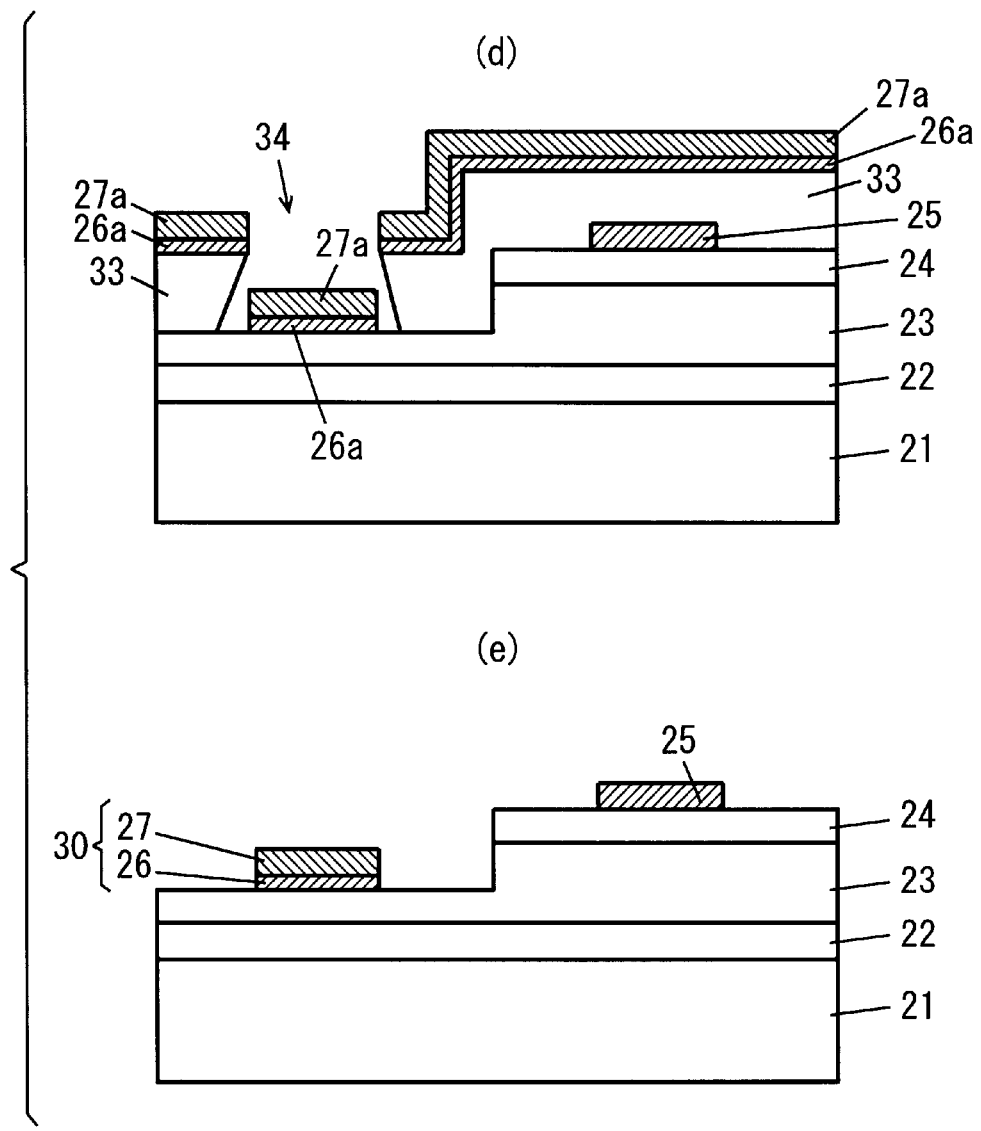
FIG. 7 is a schematic cross-sectional view showing the steps of a method of fabricating a conventional GaN based light emitting diode.

FIG. 5 is a diagram showing the result of measurement of the voltage-current characteristics of the n electrodes 8. In the measurement, a pair of n electrodes 8 was formed on each n-type GaN layer, to measure a voltage applied between the n electrodes 8 and a current flowing between the n electrodes 8.

The carrier concentration of the n-type GaN layers was set to $9 \times 10^{17}$ cm$^{-3}$, and the thicknesses of the Ti films 5 in the n electrodes 8 were set to 3 Å, 5 Å, 10 Å, 30 Å, and 100 Å.

As shown in FIG. 5, complete ohmic characteristics are obtained when the thickness of the Ti film 5 is 3 Å, 5 Å and 10 Å, and approximate ohmic characteristics are obtained when the thickness of the Ti film 5 is 30 Å. When the thickness of the Ti film 5 is 100 Å, slight rectification characteristics appear. When the thickness of the Ti film 5 is 0, that is, the n electrode 8 is composed of only the Pt film 6, no ohmic characteristics are obtained, and the resistance of the n electrode 8 is high.

Consequently, the thickness of the Ti film 5 in the n electrode 8 is preferably not more than approximately 50 Å, more preferably not more than 30 Å, and still more preferably not more than 10 Å. From the point of view of adhesive strength to the n-type GaN layer, the thickness of the Ti film 5 is preferably not less than 3 Å, and more preferably not less than 5 Å.

A scratch test was conducted using the above-mentioned measuring needle with respect to the n electrodes 8 formed on the n-type GaN layers. Consequently, the n electrode 8 was not stripped in all cases where the thickness of the Ti film 5 are 3 Å, 5 Å, 10 Å, 30 Å, and 100 Å. On the other hand, the n electrode 8 was striped in a case where it is composed of only the Pt film 6.

When the same measurement of current-voltage characteristics and scratch test were made using Pd films in place of the Pt films 6 in the p electrodes 7 and the n electrodes 8, the same results as described above were obtained.

The p electrode 7 and the n electrode 8 in the above-mentioned embodiment can be also used as ohmic electrodes on not only GaN but also the other GaN based semiconductor such as AlGaN, InGaN, InAlGaN, BGaN, BAlGaN, or BInGaN.

Although in the above-mentioned embodiment, description was made of a case where the present invention is applied to a light emitting diode, the present invention can be also applied to the other semiconductor light emitting devices such as semiconductor laser devices. Further, the present invention can be also applied to the other semiconductor devices such as field effect transistors or bipolar transistors which are formed of GaN based semiconductors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a p-type nitride based semiconductor; and
   an ohmic electrode formed on said p-type nitride based semiconductor, said ohmic electrode comprising
      a first metal film having a thickness of not less than 3 Å nor more than 150 Å which is formed in contact with said p-type nitride based semiconductor and is composed of titanium, and
      a second metal film which is formed in contact with said first metal film and is composed of platinum or palladium,
   wherein the thickness of said first metal film is not less than 3 Å nor more than 130 Å.

2. The semiconductor device according to claim 1, wherein the thickness of said first metal film is not less than 3 Å and not more than 100 Å.

3. The semiconductor device according to claim 1, further comprising
   a third metal film which is formed in contact with said second metal film and is composed of gold.

4. The semiconductor device according to claim 1, wherein
   said p-type nitride based semiconductor contains at least one of boron, gallium, aluminum, indium and thallium.

5. A semiconductor device comprising:
   a p-type nitride based semiconductor;
   an n-type nitride based semiconductor provided so as to be brought into contact with said p-type nitride based semiconductor, a first ohmic electrode formed on said p-type nitride based semiconductor; and a second ohmic electrode formed on said n-type nitride based semiconductor, said first ohmic electrode comprising
- a first metal film having a thickness of not less than 3 Å nor more than 130 Å which is formed in contact with said p-type nitride based semiconductor and is composed of titanium, and
- a second metal film which is formed in contact with said first metal film and is composed of platinum or palladium, said second ohmic electrode comprising
  - a third metal film having a thickness of not less than 3 Å nor more than 30 Å which is formed in contact with said n-type nitride based semiconductor and is composed to titanium, and
  - a fourth metal film which is formed in contact with said third metal film and is composed of platinum or palladium.

6. The semiconductor device according to claim 5, wherein the thickness of said first and third metal films is not less than 3 Å nor more than 30 Å.

7. The semiconductor device according to claim 6, wherein the thickness of said first and third metal films is not less than 3 Å nor more than 10 Å.

8. The semiconductor device according to claim 5, further comprising a fifth metal film which is formed in contact with said second metal film and is composed of gold, and a sixth metal film which is formed in contact with said fourth metal film and is composed of gold.

* * * * *